(12) United States Patent
Ayazi et al.

(10) Patent No.: US 7,888,843 B2
(45) Date of Patent: Feb. 15, 2011

(54) THIN-FILM PIEZOELECTRIC-ON-INSULATOR RESONATORS HAVING PERFORATED RESONATOR BODIES THEREIN

(75) Inventors: Farrokh Ayazi, Atlanta, GA (US); Logan D. Sorenson, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days.

(21) Appl. No.: 12/535,284

(22) Filed: Aug. 4, 2009

(65) Prior Publication Data
US 2010/0060111 A1  Mar. 11, 2010

Related U.S. Application Data

(63) Continuation-in-part of application No. 12/233,395, filed on Sep. 18, 2008, now Pat. No. 7,800,282.

(60) Provisional application No. 61/095,776, filed on Sep. 10, 2008.

(51) Int. Cl.
*H01L 41/08* (2006.01)
(52) U.S. Cl. ............... 310/324; 310/312; 310/320
(58) Field of Classification Search ............. 310/312, 310/320
See application file for complete search history.

(56) References Cited

U.S. PATENT DOCUMENTS

| | | | |
|---|---|---|---|
| 5,160,901 A | 11/1992 | Stone | |
| 5,229,735 A | 7/1993 | Quan | |
| 5,640,133 A | 6/1997 | MacDonald et al. | |
| 6,557,419 B1 | 5/2003 | Herb et al. | |
| 6,604,266 B1* | 8/2003 | Tajima et al. | 29/25.35 |
| 6,657,363 B1* | 12/2003 | Aigner | 310/324 |
| 6,739,190 B2 | 5/2004 | Hsu et al. | |
| 7,199,504 B2 | 4/2007 | Komuro et al. | |
| 7,202,761 B2 | 4/2007 | Lutz et al. | |
| 7,280,007 B2 | 10/2007 | Feng et al. | |

(Continued)

FOREIGN PATENT DOCUMENTS

EP  1 217 735 A1  6/2002

(Continued)

OTHER PUBLICATIONS

Baborowski et al., "Piezoelectrically Activated Silicon Resonators", IEEE Frequency Control Symposium, 2007 Joint with the 21$^{st}$ European Frequency and Time Forum, May 1, 2007, pp. 1210-1213, XP031138158, section I.

(Continued)

*Primary Examiner*—Mark Budd
(74) *Attorney, Agent, or Firm*—Myers Bigel Sibley & Sajovec

(57) ABSTRACT

A micro-electromechanical resonator self-compensates for process-induced dimensional variations by using a resonator body having a plurality of perforations therein. These perforations may be spaced along a longitudinal axis of the resonator body, which extends orthogonal to a nodal line of the resonator body. These perforations, which may be square or similarly-shaped polygonal slots, may extend partially or entirely though the resonator body and may be defined by the same processes that are used to define the outer dimensions (e.g., length, width) of the resonator body.

14 Claims, 12 Drawing Sheets

U.S. PATENT DOCUMENTS

| | | | |
|---|---|---|---|
| 7,312,674 | B2 | 12/2007 | Duwel et al. |
| 7,446,620 | B2 | 11/2008 | Partridge et al. |
| 7,489,063 | B2 * | 2/2009 | Isobe et al. .................. 310/312 |
| 7,608,980 | B2 | 10/2009 | Kataoka |
| 7,616,077 | B1 | 11/2009 | Wittwer et al. |
| 7,639,104 | B1 | 12/2009 | Quevy et al. |
| 7,675,389 | B2 * | 3/2010 | Yamakawa et al. .......... 333/133 |
| 2002/0096967 | A1 | 7/2002 | Ma et al. |
| 2005/0146248 | A1 | 7/2005 | Moler et al. |
| 2005/0242904 | A1 | 11/2005 | Lutz et al. |
| 2006/0125576 | A1 | 6/2006 | Ho et al. |
| 2006/0196273 | A1 | 9/2006 | Burns |
| 2006/0225504 | A1 | 10/2006 | Ayazi et al. |
| 2007/0069612 | A1 | 3/2007 | Sato |
| 2007/0220971 | A1 | 9/2007 | Ayazi et al. |
| 2007/0277620 | A1 | 12/2007 | Melamud et al. |
| 2008/0143217 | A1 | 6/2008 | Ho et al. |
| 2008/0186109 | A1 | 8/2008 | Ho et al. |
| 2009/0153267 | A1 | 6/2009 | Lutz et al. |
| 2009/0160581 | A1 | 6/2009 | Hagelin et al. |
| 2010/0032789 | A1 | 2/2010 | Schoen et al. |

FOREIGN PATENT DOCUMENTS

| | | |
|---|---|---|
| EP | 2 144 369 A1 | 1/2010 |
| WO | WO 2007/072409 A2 | 6/2007 |

OTHER PUBLICATIONS

Casinovi et al., "Analytical Modeling and Numerical Simulation of Capacitive Silicon Bulk Acoustic Resonators," IEEE International Conference on Micro Electro Mechanical Systems, Jan. 2009, pp. 935-938.

Kim et al., "Temperature Dependence of Quality Factor in MEMS Resonators," Journal of Microelectromechanical Systems, vol. 17, No. 3, Jun. 2008, pp. 755-766.

Kim et al., "Micromechanical Resonant Displacement Gain Stages,"IEEE, 2009, pp. 19-22.

Pourkamali et al., "Low-impedance VHF and UHF Capacitive Silicon Bulk Acoustic Wave Resonators—Part I: Concept and Fabrication," IEEE Transaction On Electron Devices, vol. 54, No. 8, Aug. 2007, pp. 2017-2023.

Schoen et al., "Temperature Compensation in Silicon-Based Micro-Electromechanical Resonators", IEEE Conference on Micro Electromechanical Systems 2009, Jan. 25, 2009, pp. 884-887, XP031444436, figures 1-3.

"Film Bulk Acoustic-Wave Resonator (FBAR)," Admitted Prior Art, http://mems.usc.edu/fbar.htm, Printed from the Internet Jan. 6, 2009, 3 pages.

"Finite element method," Admitted Prior Art, http://en.wikipedia.org/wiki/Finite_element_method, Printed from the Internet Oct. 28, 2008, 7 pages.

Abdolvand et al., "A Low Voltage Temperature-Stable Micromechanical Piezoelectric Oscillator," *Digest of the 14th International Conference on Solid State Sensors, Actuators and Microsystems* (Transducers '07), Lyon, France, Jun. 2007, pp. 53-56.

Abdolvand et al., "A Temperature-Compensated ZnO-on-Diamond Resonant Mass Sensor," *Proc. 5th IEEE Conference on Sensors*, 2006, pp. 1297-1300.

Abdolvand et al., "Single-Resonator Dual-Frequency Thin-Film Piezoelectric-on-Substrate Oscillator", *IEEE International Electron Devices Meeting*, 2007, pp. 419-422.

Dubois, Marc-Alexandre., "Thin film bulk acoustic wave resonators: a technology overview," MEMSWAVE 03, Toulouse, France, Jul. 2-4, 2003.

Ho et al., "High Order Composite Bulk Acoustic Resonators," *Proc. 20th IEEE International Conference on Micro Electro Mechanical Systems* (MEMS '07), Kobe, Japan, Jan. 2007, pp. 791-794.

Ho et al., "Temperature Compensated IBAR Reference Oscillators," *Proc. 19th IEEE International Conference on Micro Electro Mechanical System*,(MEMS '06), Istanbul, Turkey, Jan. 2006, pp. 910-913.

Jaakkola et al., "Piezoelectrically transduced Single-Crystal-Silicon Plate Resonators," VTT Technical Research Centre of Finland, Finland.

Nam et al., "Piezoelectric Properties of Aluminum Nitride for Thin Film Bulk Acoustic Wave Resonator," J. Korean Physical Society, 47:S309-S312 (2005).

Lin et al., "Series-Resonant VHF Micromechanical Resonator Reference Oscillators," *IEEE Journal of Solid-State Circuits*, vol. 39, No. 12, Dec. 2004, pp. 2477-2491.

Luoto et al., "MEMS on cavity-SOI wafers," Solid State Electronics 51:328-332 (2007).

Schodowski, "Resonator Self-Temperature-Sensing Using A Dual-Harmonic-Mode Crystal Oscillator," *Proc. of the 43rd Annual Symposium on Frequency Control*, Jun. 1989, pp. 2-7.

Sundaresan et al., "A Low Phase Noise 100MHz Silicon BAW Reference Oscillator," *Proc. IEEE Custom Integrated Circuits Conference*, Sep. 2006, pp. 841-844.

Vig, "Dual-mode Oscillators for Clocks and Sensors," *Procs. IEEE Ultrasonics Symposium*, vol. 2, No. 1999, pp. 859-868.

* cited by examiner

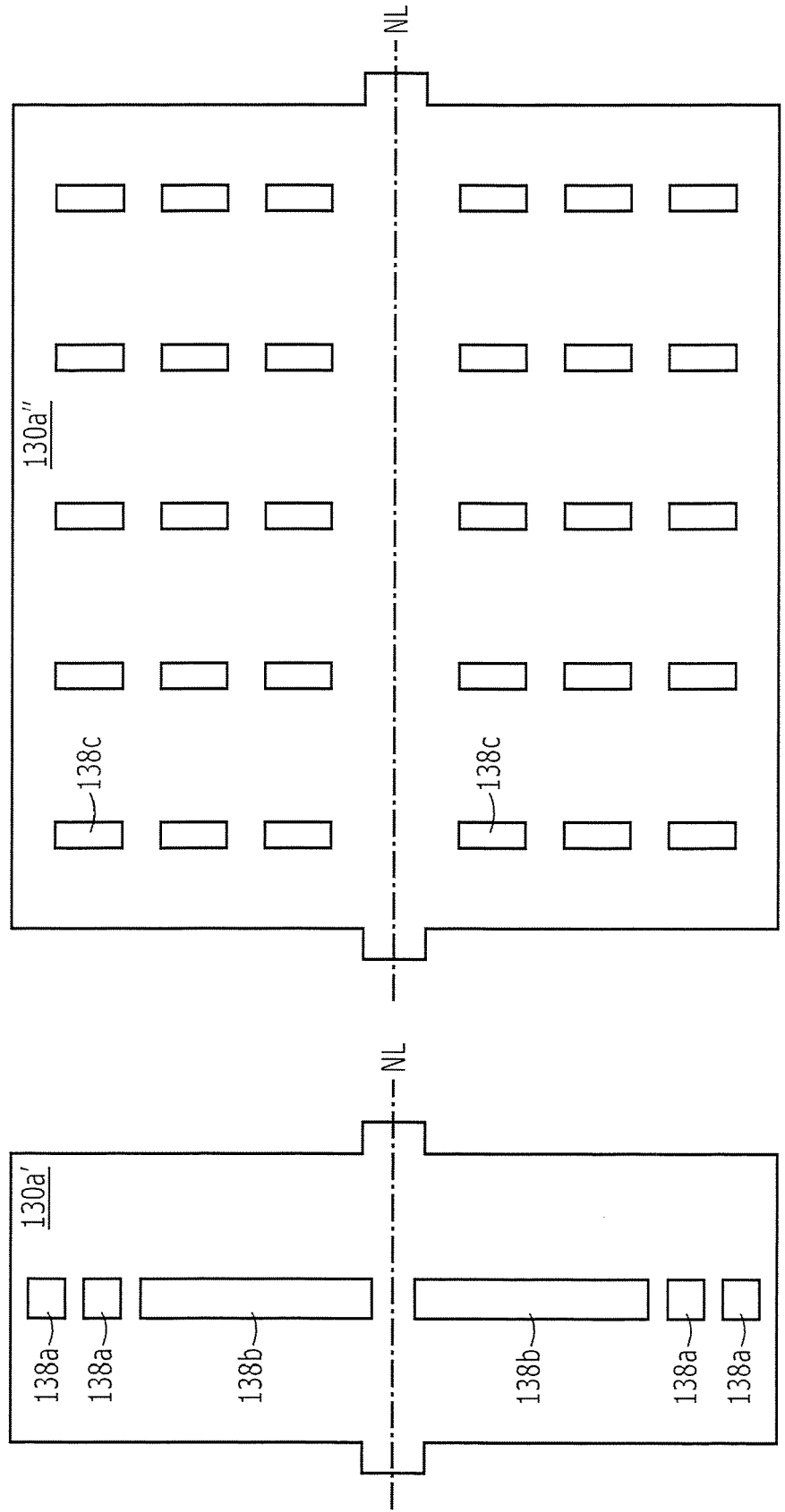

THIN-FILM PIEZOELECTRIC-ON-INSULATOR RESONATORS HAVING PERFORATED RESONATOR BODIES THEREIN

REFERENCE TO PRIORITY APPLICATIONS

This application claims priority to U.S. Provisional Application Ser. No. 61/095,776, filed Sep. 10, 2008, and is continuation-in-part of U.S. application Ser. No. 12/233,395, filed Sep. 18, 2008, now U.S. Pat. No. 7,800,282 the disclosures of which are hereby incorporated herein by reference.

BACKGROUND OF THE INVENTION

This invention relates to oscillators and operating methods thereof and, more particularly, to microelectronic oscillators and operating methods thereof.

Oscillators are widely used in microelectronic devices, for example to establish a clock frequency for the microelectronic device. Oscillators generally include a resonator, such as a quartz crystal resonator, and a driver circuit that drives the resonator to resonance.

SUMMARY OF THE INVENTION

Oscillators according to various embodiments of the present invention include a resonator having first and second electrodes and configured to resonate at a first frequency at which the first and second electrodes carry in-phase signals and at a second frequency at which the first and second electrodes carry out-of-phase signals. A driver circuit is configured to selectively sustain either the in-phase signals on the first and second electrodes or the out-of-phase signals on the first and second electrodes so that the resonator selectively resonates at either the first frequency or the second frequency, respectively. The out-of-phase signals may be 180° out of phase. Accordingly, dual-frequency single-resonator oscillators are provided, according to various embodiments of the invention.

In some embodiments, the resonator comprises a thin-film material that supports a first-order width-extensional resonance mode and a higher-order (i.e., higher than the first-order) width-extensional resonance mode. In other embodiments, the first and second electrodes are patterned to cause the thin-film material to resonate in either the first-order width-extensional resonance mode or the higher-order width-extensional resonance mode, depending on whether the driver circuit sustains the in-phase signals or the out-of-phase signals, respectively. The first and second electrodes may comprise a predetermined number of interdigitated fingers, wherein the predetermined number corresponds to the higher-order resonance mode. Thus, for example, a third-order resonance may be excited by three interdigitated fingers, a fifth order resonance may be excited by five interdigitated fingers, etc.

In other embodiments, the resonator comprises a Thin-film Piezoelectric-on-Substrate (TPoS) resonator. In some embodiments, the TPoS resonator comprises a substrate, a single crystal silicon plate that is suspended from the substrate, and a thin-film piezoelectric layer on the single crystal silicon plate, wherein the first and second electrodes are on the thin-film piezoelectric layer. The single crystal silicon plate and the thin-film piezoelectric layer thereon may also be referred to collectively herein as a resonator body. In yet other embodiments, the first and second electrodes are patterned to cause the thin-film piezoelectric layer to excite either a first-order width-extensional resonance mode or a higher-order width-extensional resonance mode in the single crystal silicon plate, depending on whether the driver circuit sustains the in-phase signals or the out-of-phase signals, respectively. In still other embodiments, the first and second electrodes comprise a predetermined number of interdigitated fingers, wherein the predetermined number corresponds to a higher-order. In other embodiments, the resonator may comprise a microelectromechanical system (MEMS) resonator.

In some embodiments, the driver circuit comprises first and second inverting amplifiers that are serially connected between the first and second electrodes to sustain the in-phase signals, and a switch that is configured to bypass one of the first or second inverting amplifiers to sustain the out-of-phase signals. Moreover, each of the first and second inverting amplifiers may comprise a single active semiconductor device, e.g., a single bipolar transistor in a common emitter configuration.

Oscillators according to still other embodiments may include a microelectronic substrate and a MEMS resonator that is suspended from the microelectronic substrate and that is configured to resonate at two different frequencies. In some embodiments, the MEMS resonator comprises a plate suspended from the microelectronic substrate and that resonates in a first-order width-extensional resonance mode, and a higher-order width-extensional resonance mode. First and second electrodes may be provided on the plate and are patterned to cause the plate to resonate in either the first-order width-extensional mode or the higher-order width-extensional resonance mode, when the electrodes are driven. The first and second electrodes may comprise a predetermined number of interdigitated fingers, wherein the predetermined number corresponds to the higher-order. In other embodiments, the MEMS resonator comprises a TPoS resonator as was described above.

Oscillators according to yet other embodiments of the invention include a microelectronic substrate, a single crystal silicon plate that is suspended from the microelectronic substrate, a thin-film piezoelectric layer on the single crystal silicon plate, and first and second electrodes on the thin-film piezoelectric layer. The first and second electrodes are configured to cause the thin-film piezoelectric layer to resonate the single crystal silicon plate at either a first frequency or at a second frequency. The electrodes may be configured as described above, and a driver circuit may be provided as described above.

Still other embodiments provide methods of driving a resonator that includes first and second electrodes connected thereto. These methods comprise selectively sustaining either in-phase signals on the first and second electrodes or out-of-phase signals or the first and second electrodes to cause the resonator to selectively resonate at either a first frequency or a second frequency, respectively. Method analogs to any of the embodiments described herein may be provided.

According to still further embodiments of the present invention, a micro-electromechanical resonator, such as a thin-film piezoelectric-on-substrate (TPoS) resonator, is provided that self-compensates for process-induced variations in dimensions of the resonator by inhibiting changes in a stiffness-to-mass ratio of a resonator body during fabrication. Although not wishing to be bound by any theory, it is believed that significant changes in the resonant frequency of a resonator can occur in response to process-induced changes in a length and/or width of the resonator body. These process-induced changes in dimension can cause a disproportionate shift in the stiffness of the resonator body relative to a shift in mass of the resonator body.

According to some embodiments of the invention, process-induced changes in a stiffness-to-mass ratio of the resonator body can be reduced by designing the resonator body to have at least two parallel extensional members that are coupled by cross members. The cross members can be defined by a plurality of perforations that are spaced along a longitudinal axis of the resonator body, which extends orthogonal to a nodal line of the resonator body. These perforations, which may be square or similarly-shaped polygonal, circular or elliptical-shaped slots that extend partially or entirely though the resonator body, can be defined by the same processes that are used to define the outer dimensions (e.g., length, width) of the resonator body. Accordingly, the dimensions of the slot(s) can experience the same process-induced variations that occur to the resonator body during manufacture. Thus, when the resonator body and the perforation(s) change in size in response to process-induced variations, the size, mass and stiffness of the cross members may also change. The changes in the size and mass of the cross members operate to compensate for the changes in outer dimensions of the resonator body so that the overall stiffness-to-mass ratio of the resonator body remains relatively unchanged. This means the resonant frequency of the resonator is less susceptible to change, notwithstanding changes in a critical dimension of the resonator body. Moreover, the position and size of the perforation(s) can also be used to individually tune the stiffness and mass to desired values so that the stiffness-to-mass ratio has a reduced susceptibility to geometric variations in resonator body dimensions.

BRIEF DESCRIPTION OF THE DRAWINGS

FIG. 14A is a plan view of a resonator body having perforations therein, according to additional embodiments of the present invention.

FIG. 14B is a plan view of a resonator body having perforations therein, according to some embodiments of the present invention.

DETAILED DESCRIPTION

Figure 1:
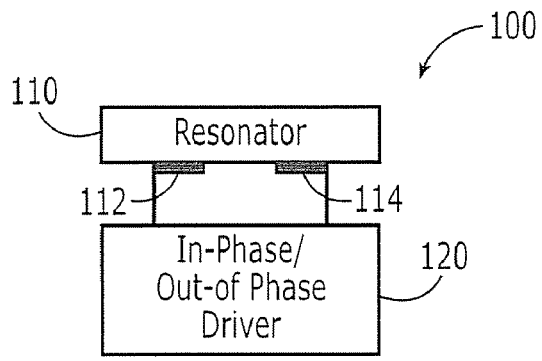
FIG. 1 is a block diagram of an oscillator according to various embodiments of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of an oscillator according to various embodiments of the present invention. As shown in FIG. 1, these oscillators 100 include a resonator 110 having first and second electrodes 112, 114, respectively. The resonator 110 is configured to resonate at a first frequency at which the first and second electrodes 112, 114 carry in-phase signals and at a second frequency at which the first and second electrodes 112, 114 carry out-of-phase signals. A driver circuit 120 is configured to selectively sustain either the in-phase signals on the first and second electrodes 112, 114 or the out-of-phase signals on the first and second electrodes 112, 114, so that the resonator 110 selectively resonates at either the first frequency or the second frequency, respectively. In some embodiments, the resonator 110 comprises a thin-film material that supports a first-order width-extensional resonance mode, and a higher-order (i.e., higher than the first-order) width-extensional resonance mode. In some embodiments, the first and second electrodes are patterned to cause the thin-film material to resonate in either the first-order width-extensional mode or the higher-order width-extensional resonance mode, as will be described below. The resonator may comprise a Thin-film Piezoelectric-on-Substrate (TPoS) resonator, as will be described in detail below.

Figure 2:
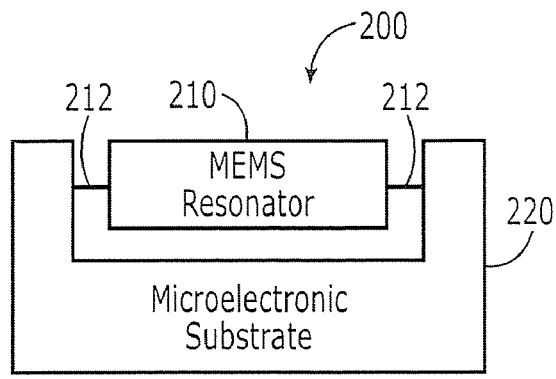
FIG. 2 is a cross-sectional view of a MEMS resonant structure according to various embodiments of the present invention.

FIG. 2 is a cross-sectional view of resonant structures according to other embodiments of the present invention. In these embodiments, these resonant structures 200 include a microelectronic substrate 220 and a microelectromechanical system (MEMS) resonator 210 that is suspended from the microelectronic substrate 220, for example using tethers 212, and that is configured to resonate at two different frequencies. The MEMS resonator 210 may comprise a plate suspended from the microelectronic substrate 220 and that resonates in a first-order width-extensional resonance mode and a higher-order width-extensional resonance mode. The microelectronic substrate 220 may be any substrate that is conventionally used to fabricate microelectronic devices, including single element substrates comprising single crystal silicon, compound substrates comprising, for example gallium arsenide, and multiple layer substrates including, for example Silicon-On-Insulator (SOI) substrates, nanocrystalline diamond-on-silicon, etc. Moreover, as used herein, "MEMS" to refers to a micromachining technology which uses tools and techniques that were developed for the microelectronics industry to build microscopic moving machines, such as sensors, actuators, resonators, etc. In some embodiments, the MEMS resonator 210 comprises a Thin-film Piezoelectric-on-Substrate (TPoS) resonator. However, other MEMS resonators may be used, such as pure piezoelectric resonators, piezoelectric-on-oxide resonators and/or any other resonator that is configured to resonate at a first frequency at which first and second electrodes thereof carry in-phase signals and at a second frequency at which the first and second electrodes carry out-of-phase signals and/or that can operate in a first-order width-extensional resonance mode or a higher-order width-extensional resonance mode.

Figure 3:
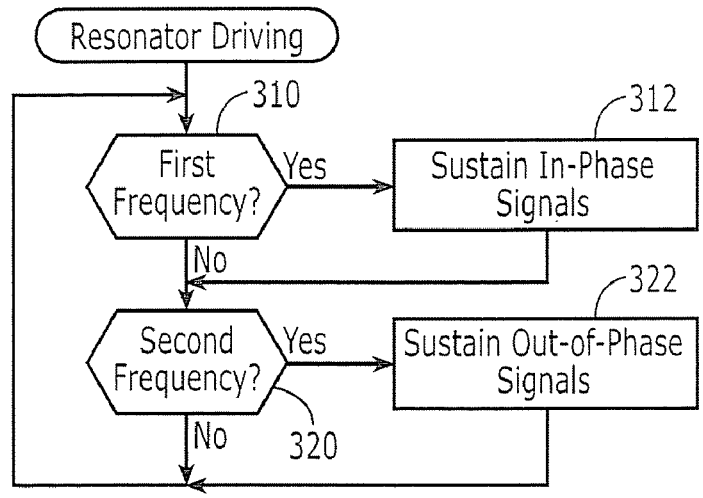
FIG. 3 is a flowchart of operations that may be performed to drive a resonator according to various embodiments of the present invention.

FIG. 3 is a flowchart of operations that may be performed to drive a resonator, such as a resonator 110 of FIG. 1, which includes first and second electrodes, such as electrodes 112 and 114, connected thereto. As shown in FIG. 3, if it desired to drive the resonator at a first frequency, as shown in Block 310, then in-phase signals are sustained on the first and second electrodes at Block 312. Alternatively, if it is desired to drive the resonator at a second frequency 320, then at Block 322, out-of-phase signals are sustained on the first and second electrodes. Accordingly, FIG. 3 illustrates methods of driving a resonator by selectively applying either in-phase signals on the first and second electrodes or out-of-phase signals on the first and second electrodes, to cause the resonator to selectively resonate at either a first frequency or a second frequency, respectively.

Figure 4A:
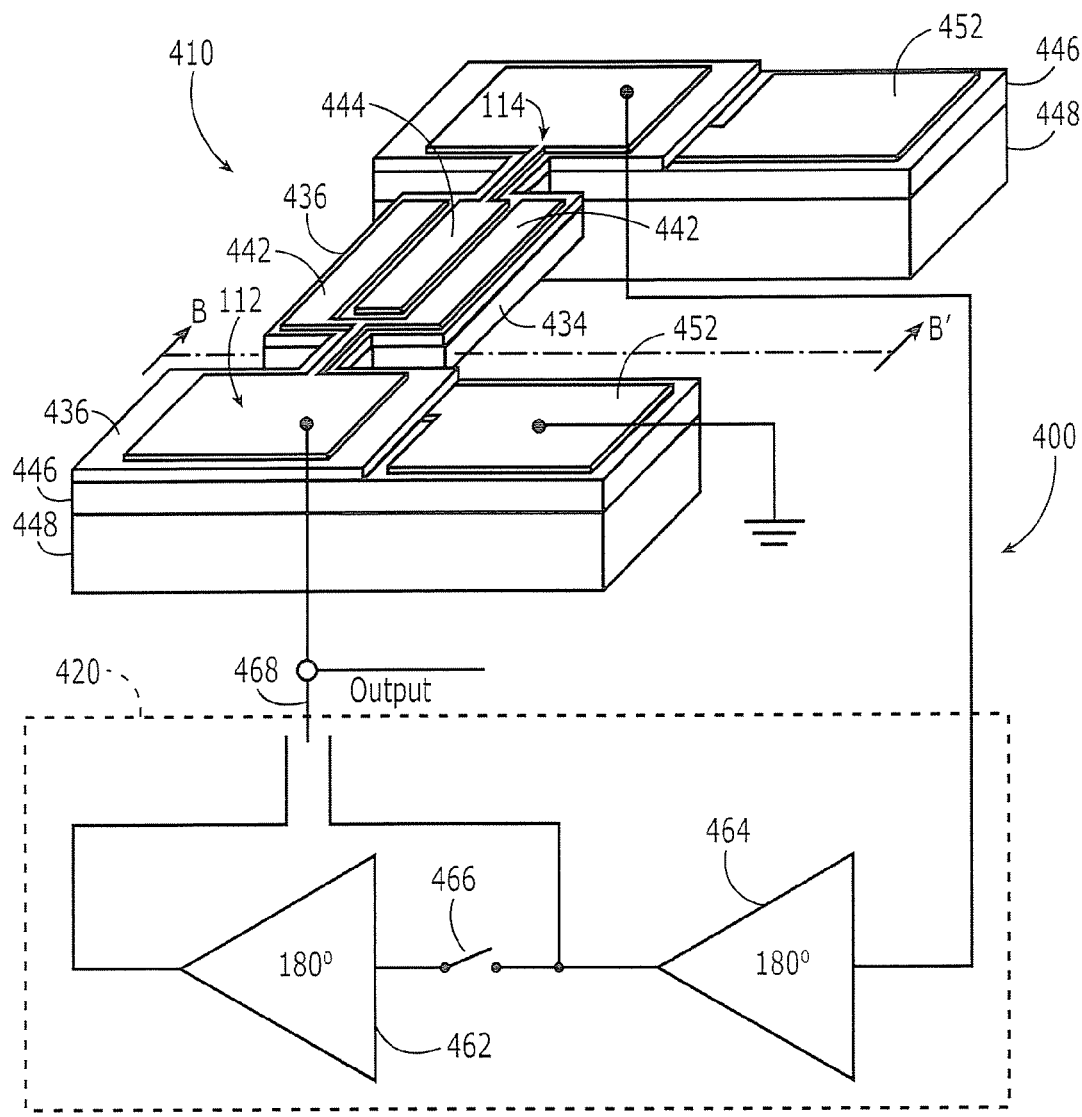
FIG. 4A is a combined perspective view and block diagram of an oscillator according to various embodiments of the present invention.
Figure 4B:
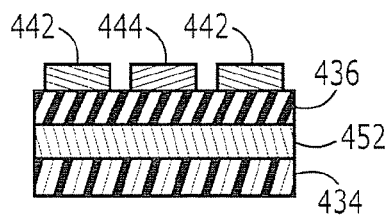
FIG. 4B is a cross-sectional view taken along the line B-B' of FIG. 4A according to various embodiments of the present invention.

FIG. 4A is a combined perspective view and block diagram of an oscillator according to various embodiments of the present invention, and FIG. 4B is a cross-sectional view taken along line B-B' according to various embodiments of the invention. Referring now to FIGS. 4A and 4B, these oscillators 400 include a TPoS resonator 410 which may be regarded as an embodiment of resonator 110 of FIG. 1 and/or a MEMS resonator 210 of FIG. 2, and an in-phase/out-of-phase driver circuit 420 which may be regarded as an embodiment of driver circuit 120 of FIG. 1. As shown in FIGS. 4A and 4B, the TPoS resonator 410 comprises a microelectronic substrate 448 which may be a single element substrate comprising single crystal silicon, a compound substrate comprising, for example gallium arsenide, or a multiple layer substrate including, for example Semiconductor-On-Insulator (SOI), nanocrystalline diamond-on-silicon, etc. A single crystal silicon plate 434 is suspended from the microelectronic substrate 448, for example in a cavity thereof, using tethers 112, 114 and/or other conventional elements. A thin-film piezoelectric layer 436 is on the single crystal silicon plate 434. A first electrode 442 and a second electrode 444, which may correspond to the first and second electrodes 112 and 114 of FIG. 1, are provided on the thin-film piezoelectric layer 436.

In some embodiments, the single crystal silicon plate 434 is fabricated from a single crystal silicon layer 446 that is on an insulating layer, such as an oxide layer, which itself is on a substrate, such as a silicon substrate, such that the combination of the microelectronic substrate 448 and the single crystal silicon layer 446 in which the single crystal silicon plate 434 is fabricated, provides a Silicon-On-Insulator (SOI) substrate. A grounding electrode 452 may also be provided between the thin-film piezoelectric layer 436 and the single crystal silicon plate 434. Moreover, the combination of the single crystal silicon plate 434 and the thin-film piezoelectric layer 436, along with one or more electrodes, such as electrodes 442, 444 and 452 can provide a Thin-film Piezoelectric-on-Silicon (TPoS) resonator. It will be understood that the single crystal silicon plate 434, thin-film piezoelectric layer 436 and the electrodes 442, 444 and 452, respectively, may have various spatial arrangements relative to one another, according to various embodiments of the present invention.

Figure 5A:
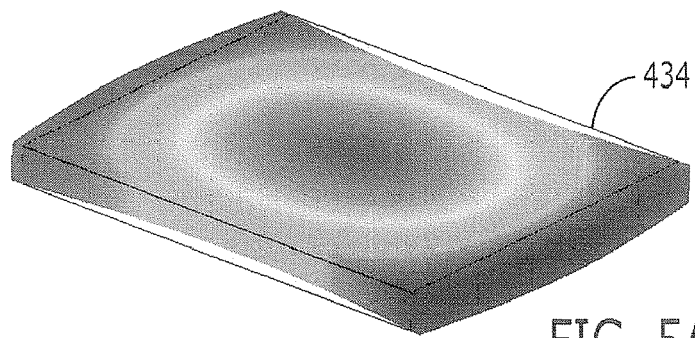
FIGS. 5A and 5B illustrate resonance mode shapes of a rectangular silicon plate simulated in FEMLAB when resonating in a first-order mode and a third-order mode, respectively, according to various embodiments of the present invention.
Figure 5B:
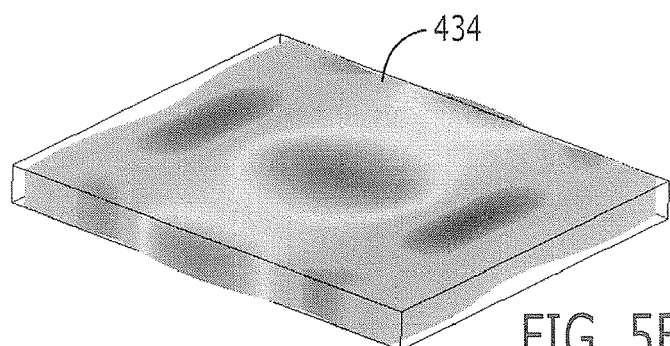

Still referring to FIGS. 4A and 4B, in some embodiments, the first and second electrodes 442, 444, respectively, are patterned to cause the thin-film piezoelectric layer 436 to excite either a first-order width-extensional resonance mode in the silicon plate 434, as shown in FIG. 5A, or a third-order width-extensional resonance mode in the silicon plate 434, as shown in FIG. 5B. Moreover, in some embodiments, the first electrode 442 comprises a pair of spaced apart fingers on the thin-film piezoelectric layer 436, as illustrated in FIGS. 4A and 4B, and the second electrode 444, comprises a finger on the thin-film piezoelectric layer 436 that extends between the pair of spaced apart fingers, as also illustrated in FIGS. 4A and 4B. In some embodiments, the thin-film piezoelectric layer 436 comprises an aluminum nitride thin-film layer. However, other thin-film piezoelectric materials, such as ZnO, PZT and/or $BaTiO_3$ may be used.

More generally, as illustrated in FIGS. 4A and 4B, the first and second electrodes 442, 444 may be patterned to cause the thin-film piezoelectric layer 436 to excite either the first-order width-extensional resonance mode or a higher-order width-extensional resonance mode, such as a third-order, fifth-order, etc., in the single crystal silicon plate 434. Moreover, the first and second electrodes 442, 444 may comprise a predetermined number of interdigitated fingers, wherein the predetermined number corresponds to the higher-order resonance mode. Thus, three interdigitated fingers, as illustrated in FIGS. 4A and 4B, may be used to cause the single crystal silicon plate 434 to resonate in either the first-order width-extensional resonance mode or the third-order width-extensional resonance mode, five interdigitated fingers may be used to cause the single crystal silicon plate 434 to resonate in either the first-order width-extensional resonance mode or the fifth-order width-extensional resonance mode, etc. Thus, the predetermined number of interdigitated fingers may correspond to the higher-order mode that is desired for resonance.

Referring again to FIG. 4A, a driver circuit 420, according to some embodiments, includes first and second inverting amplifiers 462, 464, respectively, that are serially connected between the first and second electrodes 442 and 444, respectively, to sustain the in-phase signals, and a switch, such as switches 466, 468, that is configured to bypass one of the first 442 or second 444 inverting amplifiers, to sustain the out-of-phase signals. Thus, the first and second inverting amplifiers 462, 464 form a loop with the resonator 410 that sustains oscillation at either the first-order frequency or the higher-order frequency. The output frequency for the oscillator may be obtained as shown in FIG. 4A by "Output", and/or at other places in the circuit.

The inverting amplifiers 462, 464 may be embodied by operational amplifiers, inverters, logic gates and/or other amplifier circuits, in some embodiments of the invention. However, as will be described in detail below, in other embodiments, the first and second inverting amplifiers 464, 466 each comprises a single active device, such as a single bipolar transistor in a common emitter configuration. Moreover, the one or more bypass switches 466, 468 may be provided in many different configurations and locations according to various embodiments of the present invention. As shown in FIG. 4A, the first and second amplifiers 462, 464 support 180° out-of-phase signals. However, other out-of-phase signal relationships may be provided.

Additional discussion of various embodiments of the present invention will now be provided.

In particular, some embodiments can provide sub-milliwatt, dual-frequency oscillators that utilize two high-Q acoustic modes of an AlN-on-Si microresonator. While operating in atmospheric pressure, some embodiments can show $Q_{unloaded}$ of 7100 at 35.5 MHz, and 4000 at 105.7 MHz corresponding to the first-order and the third-order width-extensional resonance modes. The measured $Q_{unloaded}$ may increase to 10100 in vacuum for the first-order resonance mode. The phase-noise of a two-transistor oscillator circuit using this resonator at 1 kHz offset from the carrier is −94 dBc/Hz and −88 dBc/Hz, for the low and high frequency modes, respectively, with a far-from-carrier noise of −143 dBc/Hz.

In the evolution of electronic microsystems, it may be desirable to integrate high-Q resonators with electronics. This integration can give the system designers the opportunity to add new features to future products without the need to pay substantial size and/or cost penalties. Recent progress in fabrication of capacitive micromechanical resonators has raised hope for medium to high frequency miniaturized oscillators that can replace quartz crystal in many applications. Note for example, Sundaresan et al., "A Low Phase Noise 100 MHz Silicon BAW Reference Oscillator," *Proc. IEEE Custom Integrated Circuits Conference*, September 2006, pp. 841-844; Ho et al., "Temperature Compensated IBAR Reference Oscillators," *Proc. 19th IEEE International Conference on Micro Electro Mechanical System*, (MEMS '06), Istanbul, Turkey, January 2006, pp. 910-913; and Lin et al., "Series-Resonant VHF Micromechanical Resonator Reference Oscillators," *IEEE Journal of Solid-State Circuits*, Vol. 39, No. 12, December 2004, pp. 2477-2491. However, the motional impedance of capacitive resonators tends to increase rapidly with frequency. In addition, they may require relatively large DC polarization voltages, deep-sub-micron air-gaps, and costly vacuum packaging for operation. Moreover, their absolute frequency accuracy and temperature stability may degrade at higher frequencies where the frequency determining device features are small and conventional tuning mechanisms become inefficient.

Piezoelectric resonators, on the other hand, may provide advantages over capacitive devices at high frequencies. Their motional impedance is reasonably small while operating at atmospheric pressure. They do not generally require a DC polarization voltage, and high-order lateral mode designs are less susceptible to the process-induced critical size variation, as noted in Ho et al., "High Order Composite Bulk Acoustic Resonators," *Proc. 20th IEEE International Conference on Micro Electro Mechanical Systems* (MEMS '07), Kobe, Japan, January 2007, pp. 791-794. Also, including an oxide layer in the resonant structure of a Thin-film Piezoelectric-on-Substrate (TPoS) resonator has proven effective in greatly improving the temperature stability of these devices, as noted in Abdolvand et al., "A Low Voltage Temperature-Stable Micromechanical Piezoelectric Oscillator," *Digest of the 14th International Conference on Solid State Sensors, Actuators and Microsystems* (Transducers '07), Lyon, France, June 2007, pp. 53-56; and Abdolvand et al., "A Temperature-Compensated ZnO-on-Diamond Resonant Mass Sensor," *Proc. 5th IEEE Conference on Sensors*, 2006, pp. 1297-1300. The use of a low acoustic loss substrate such as single crystal silicon in TPoS resonators can provide for high Q values in air, and can enhance the power handling of the resonators, which in turn can improve the close-to-carrier as well as far-from-carrier phase-noise of the oscillator.

Various embodiments of the invention can provide a new characteristic of high-order TPoS resonators that can be attractive for many applications, such as multi-standard wireless transceivers, accurate sensors, and highly stabilized clock generators. Dual-mode excitation of quartz crystal resonators is a commonly used in order to accurately compensate for environmental interferences, as described in Vig, "Dual-mode Oscillators for Clocks and Sensors," *Procs. IEEE Ultrasonics Symposium*, Vol. 2, No., 1999, pp. 859-868. The dual-harmonic quartz oscillators are among the most accurate temperature-compensated oscillators available in the market. The principle of operation is based on using two different resonance modes of a single quartz plate, for example first and third harmonics, as described in Schodowski, "Resonator Self-Temperature-Sensing Using A Dual-Harmonic-Mode Crystal Oscillator," *Proc. of the 43rd Annual Symposium on Frequency Control*, June 1989, pp. 2-7. Since the Temperature Coefficient of Frequency (TCF) for each mode is different, the oscillator itself can be used as a very accurate temperature sensor. However, in order to excite the crystal in two frequencies, mode-suppression circuits generally are required in each oscillation loop to attenuate the signal which is amplified in the other loop. In sharp contrast, a high-order resonator according to various embodiments of the invention can be excited in two harmonic modes using a very simple scheme with reduced or minimal power consumption. Some embodiments of the invention may open new opportunities for TPoS oscillators to achieve higher level of accuracy while used as sensors and clock generators.

A TPoS resonator according to some embodiments is comprised of a thin-film piezoelectric layer 436 sandwiched between electrodes 452 and 442/444 stacked on top of a relatively thick single crystal silicon plate 434, as was illustrated in FIGS. 4A and 4B. However, other configurations of TPoS resonators may be used.

The single crystal silicon plate or layer 434 forms the main body of the resonant structure, and the metal electrodes 442 and 444 are patterned to match the strain field in a targeted resonance mode shape. With a careful electrode design, the coupling factor is enhanced or optimized, and the motional impedance of the resonator is reduced or minimized. In some embodiments, the top electrode is split into two electrically isolated electrodes 442/444 that resemble a three-finger interdigitated transducer. This pattern is designed to match the periodic strain field pattern of a block structure excited in its third-order width-extensional resonance mode illustrated in FIG. 5B.

When the resonator is excited in this mode-shape, opposite charges are accumulated on the two electrodes 442/444 since the strain polarity is changing from one finger to the other. Therefore signal phase is reversed at resonance. The same electrode pattern can also excite the first-order resonance mode where strain field is uniform across the entire device (FIG. 5A). However, in this mode shape the electrode signals are in-phase at resonance. This is in contrast with the other thickness-mode resonators, such as quartz crystal excited in their odd harmonics, which exhibit the same zero signal phase-shift at all modes.

Some embodiments of the invention may arise from recognition that the above-mentioned characteristic of a high-order TPoS resonator can be exploited to realize a dual-frequency oscillator with a single resonator. Other resonators that exhibit this in-phase/out-of-phase signal characteristic as a function of the order of the width-extensional resonance mode may also be used in other embodiments. As shown in FIG. 4A, each amplification stage 462, 464 introduces 180° of phase shift. Therefore, when only one amplification stage 464 is included in the oscillator loop, the sustained oscillation frequency corresponds to the third-order resonance mode (FIG. 5B) in which 180° phase-shift will be introduced by the resonator. In contrast, if both of the amplification stages 464, 466 are included in the loop, the low frequency first-order mode (FIG. 5A) will be sustained in which input and output signals are in-phase at resonance. In some embodiments, no precautions need to be taken for mode-suppression as a result of the additional phase-shift in the third harmonic. Moreover, as described above, higher-order harmonics may be supported using larger numbers of interdigitated electrodes.

Figure 6:
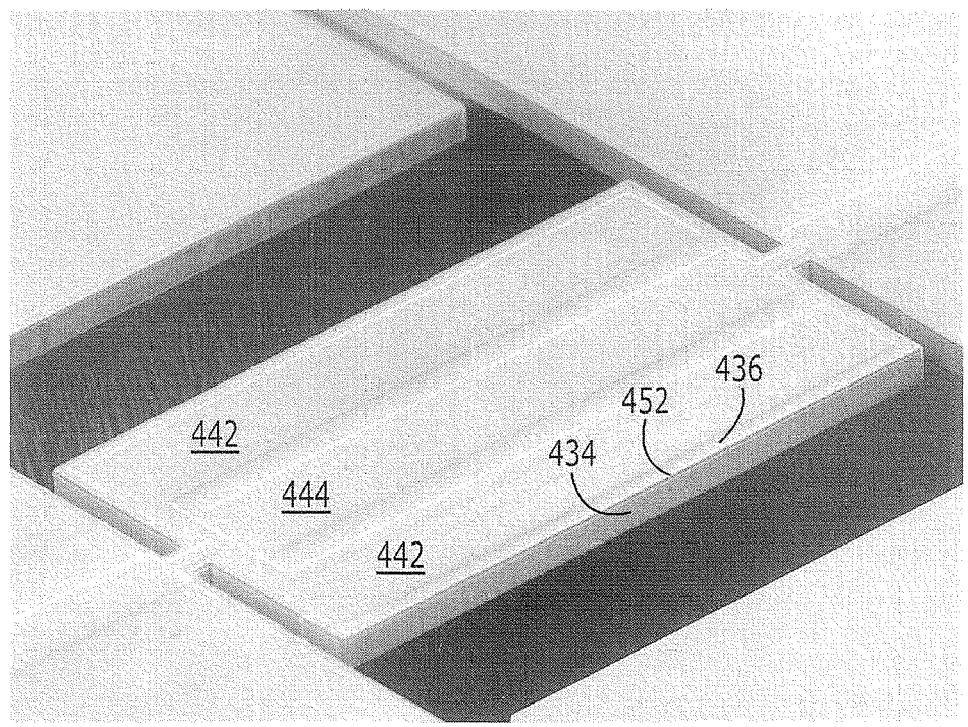
FIG. 6 is a Scanning Electron Micrograph (SEM) of an aluminum nitride-on-silicon micro-resonator according to various embodiments of the present invention.

A TPoS resonator used according to some embodiments is shown in the SEM picture of FIG. 6. The resonator is fabricated on a 10 μm-thick Silicon-On-Insulator (SOI) substrate. The thin-film piezoelectric layer 436 is a 1 μm thick sputtered AlN layer and the resonator may be fabricated, for example, using processes described in Abdolvand et al., "A Low Voltage Temperature-Stable Micromechanical Piezoelectric Oscillator," *Digest of the 14th International Conference on Solid State Sensors. Actuators and Microsystems* (Transducers '07), Lyon, France, June 2007, pp. 53-56, the disclosure of which is hereby incorporated herein by reference in its entirety as if set forth fully herein. Other MEMS fabrication techniques also may be used.

Figure 7A:
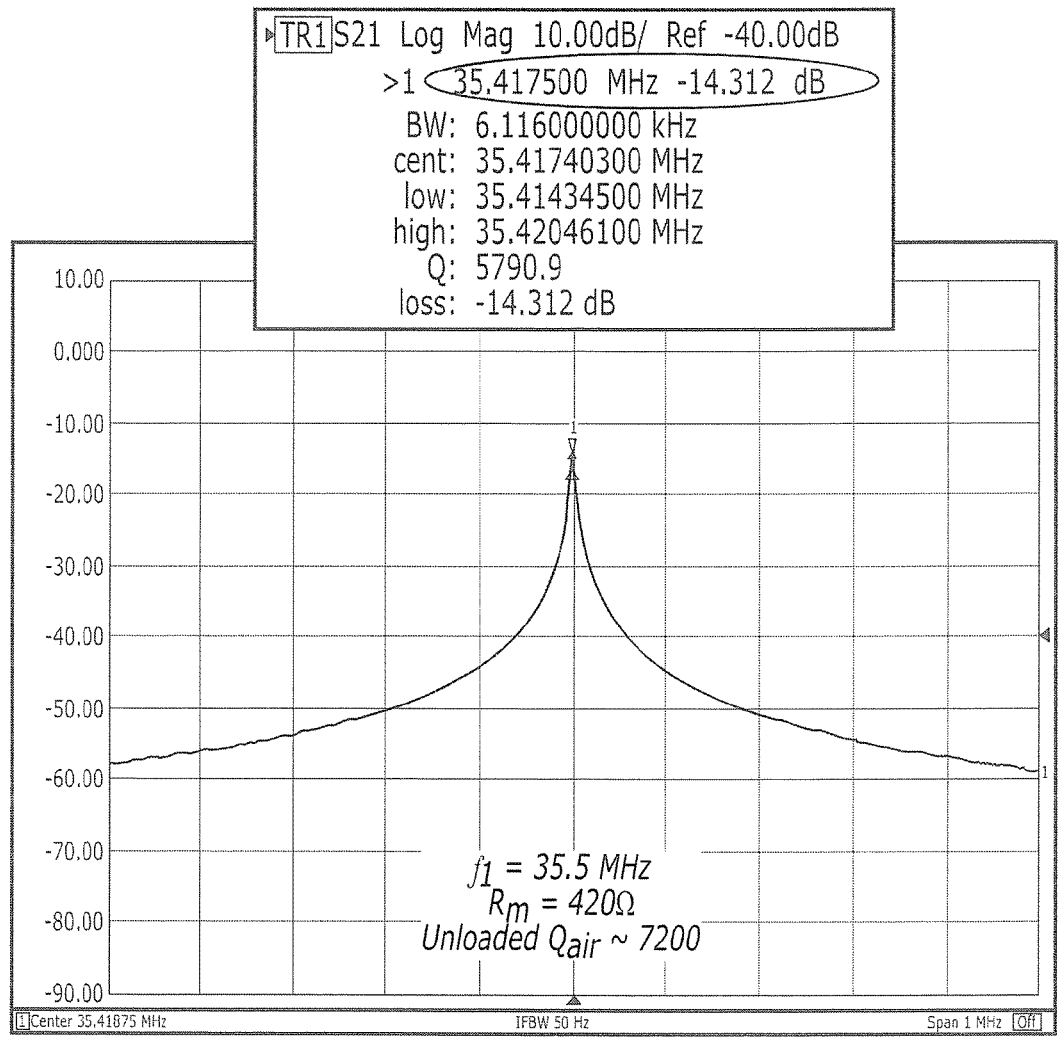
FIGS. 7A and 7B graphically illustrate a first-order and a third-order frequency response in air of an oscillator of FIG. 6, respectively.
Figure 7B:
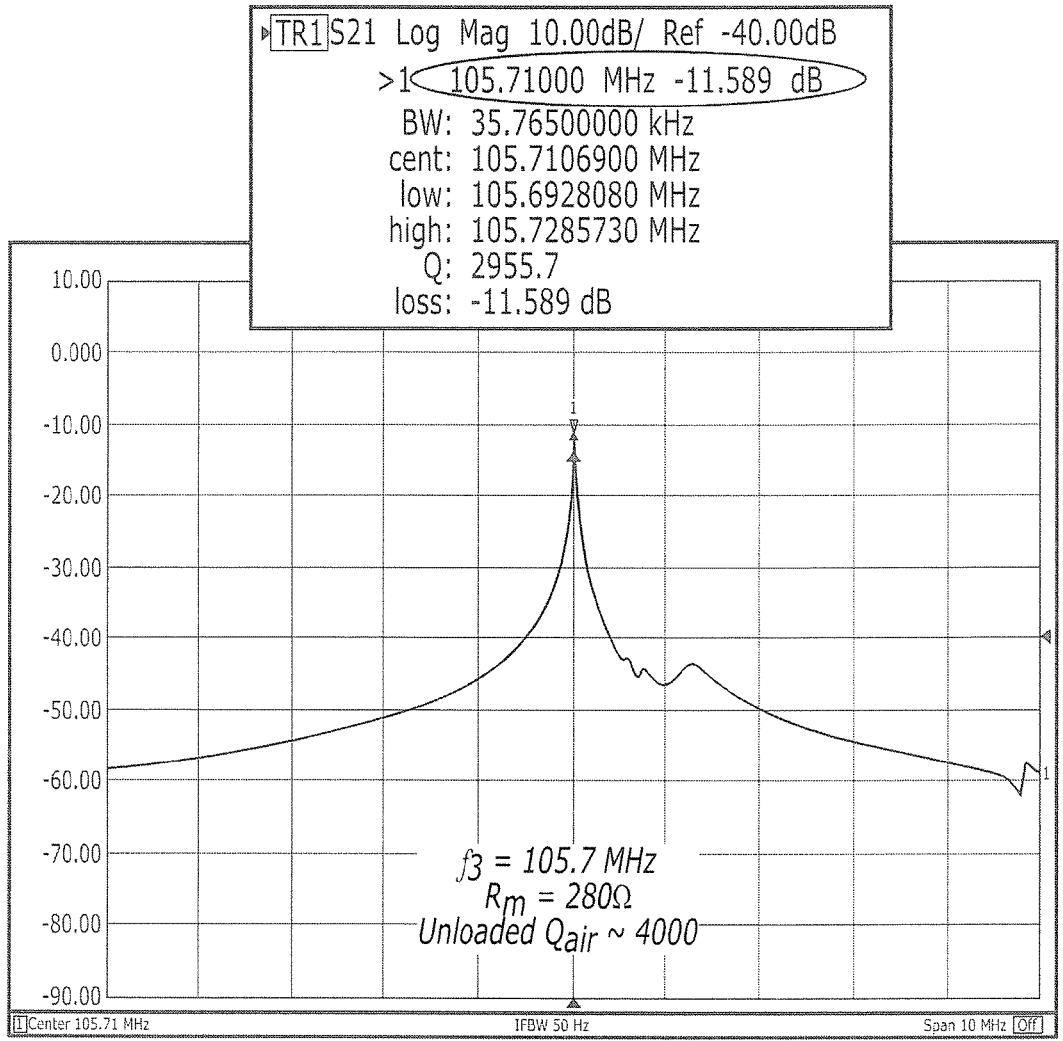

In embodiments of FIG. 6, the center-to-center finger pitch on this device is 40 μm and connection to the electrodes is in Ground-Signal-Ground (GSG) configuration with 150 μm pitch size. All the frequency response plots herein were measured by an E5071C Agilent network analyzer in a Lakeshore vacuum probe station with a heated chuck. The frequency response plots measured from the device in air are shown in FIGS. 7A and 7B. FIG. 7A graphically illustrates the first-order frequency response and FIG. 7B graphically illustrates the third-order frequency response.

Figure 8A:
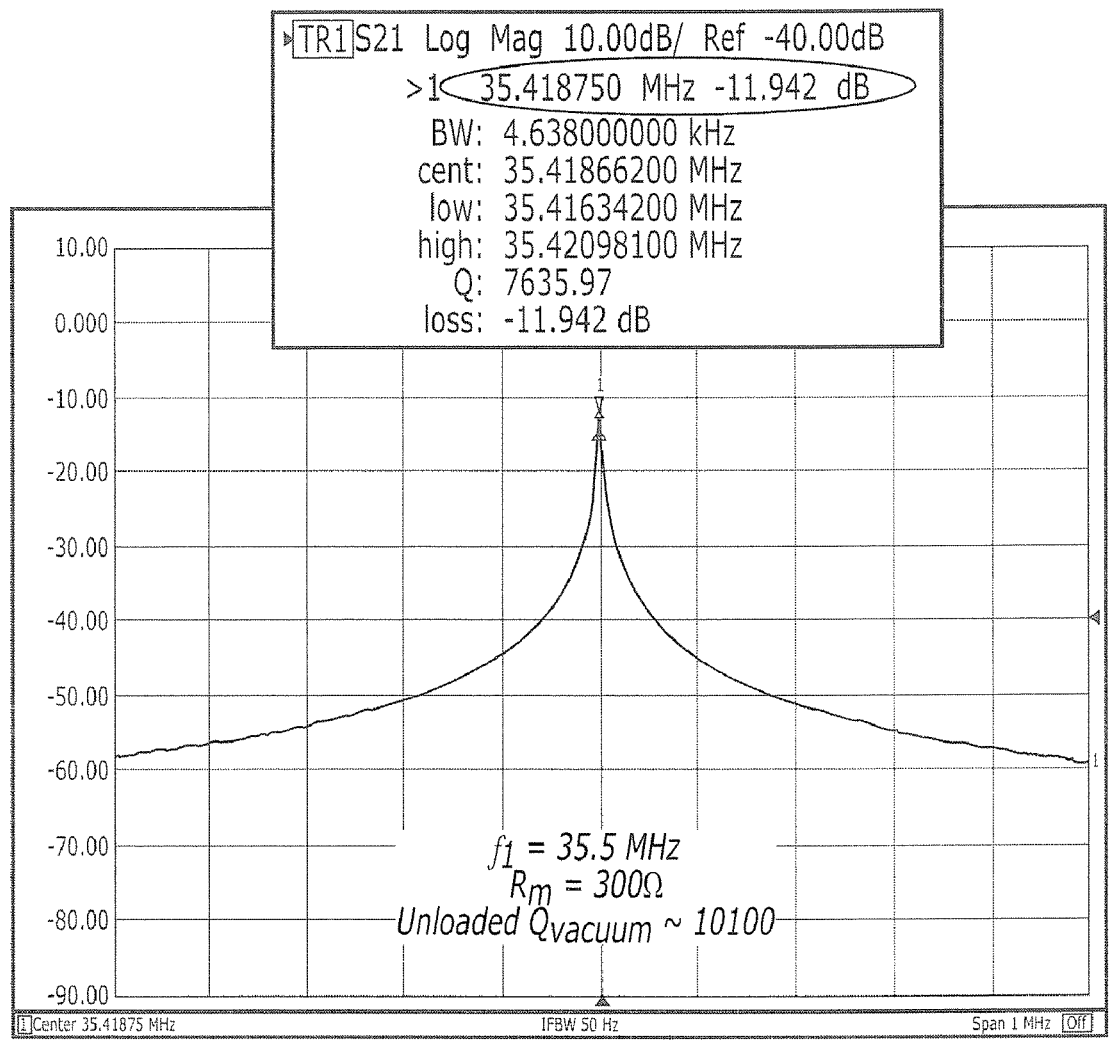
FIGS. 8A and 8B graphically illustrate a first-order and a third-order frequency response in vacuum of an oscillator of FIG. 6, respectively.
Figure 8B:
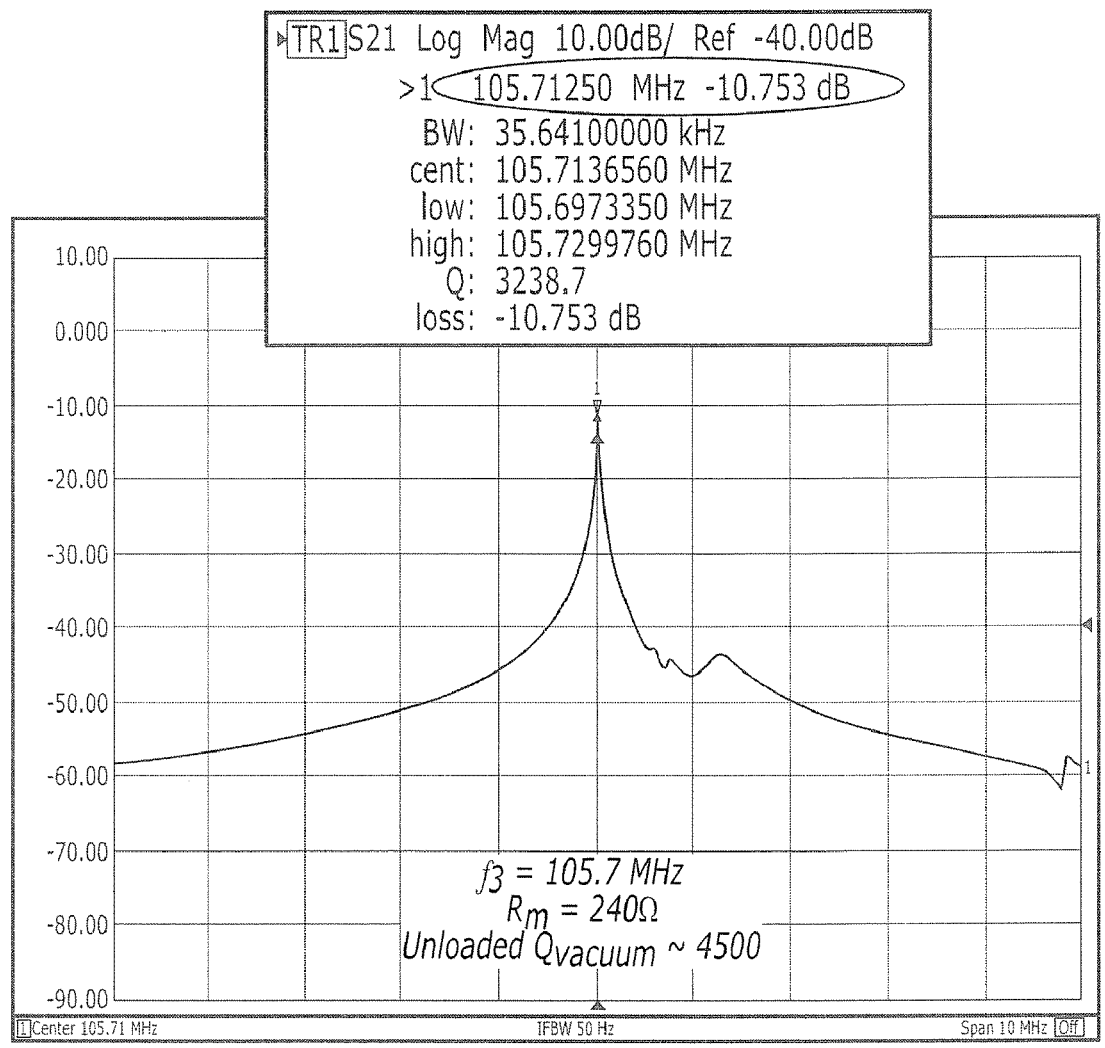

The measurements are repeated in vacuum and results are shown in FIGS. 8A and 8B for the first-order and third-order frequency response, respectively. As expected, the measured quality factors are improved and the motional impedances are reduced, inversely proportional with the Q. However, the improvement ratio for the lower frequency mode (10100/7200) is more than what is observed for the higher frequency mode (4500/4000), which indicates that the dominant loss mechanism at higher frequencies is not air damping.

Figure 9:
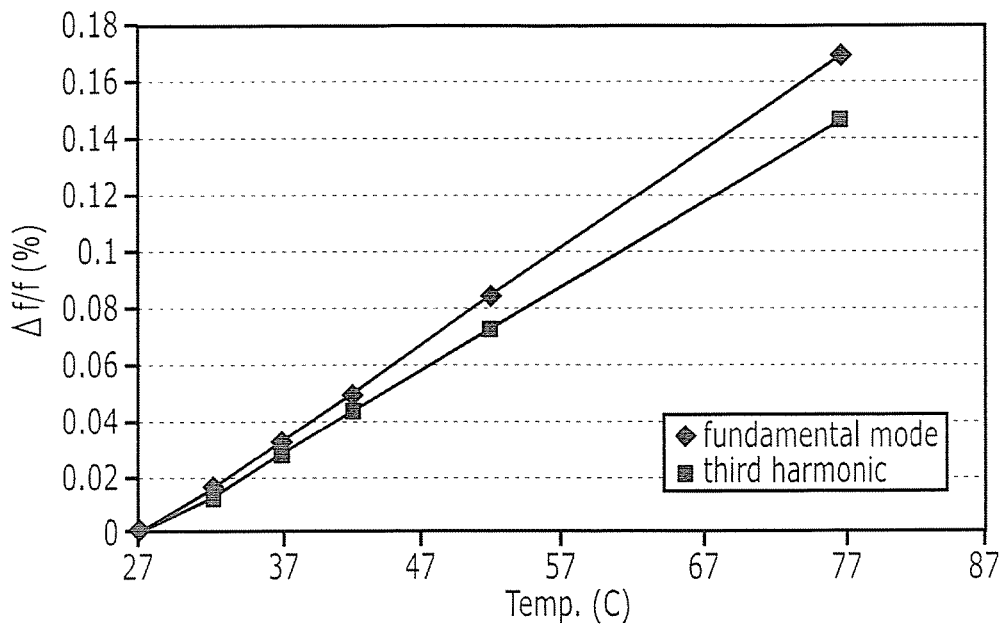
FIG. 9 graphically illustrates percentage normalized frequency change with temperature for the two resonance modes of FIGS. 7A-8B, using Temperature Coefficient of Frequency (TCF) values of −33 ppm/° C. and −28 ppm/° C. according to various embodiments of the present invention.

The frequency shift of the resonator with temperature for the two modes were measured and plotted as percentage normalized frequency change in FIG. 9. As shown, the TCF is slightly different for the two modes. This temperature characteristic may be useful in a technique developed for accurate measurement of the resonator temperature, as described in Schodowski, "Resonator Self-Temperature-Sensing Using A Dual-Harmonic-Mode Crystal Oscillator," *Proc. of the 43rd Annual Symposium on Frequency Control*, June 1989, pp. 2-7.

Figure 10:
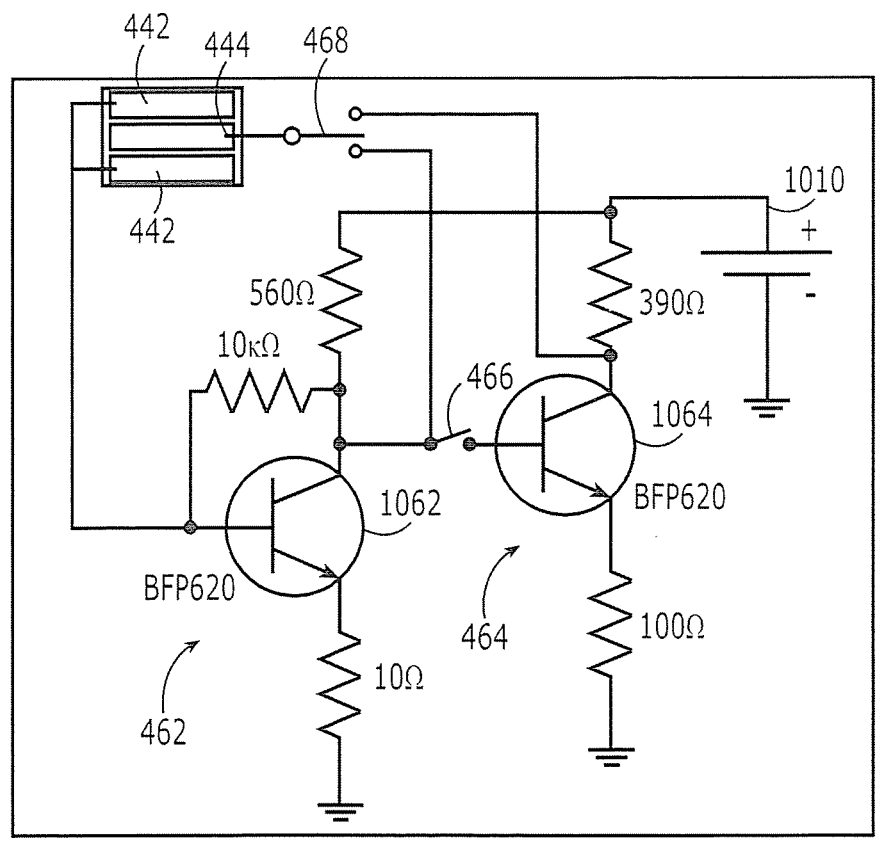
FIG. 10 is a schematic circuit diagram of a driver circuit according to various embodiments of the present invention.

A schematic diagram of a two-stage amplifier according to various embodiments is shown in FIG. 10, which may correspond to the driving circuit 420 of FIG. 4A. The amplifier may be integrated on the microelectronic substrate 448. The first stage 462 is a transimpedance amplifier (TIA) comprised of a single NPN transistor ($f_{max}$~70 GHz) 1062 in common-emitter configuration. An emitter degeneration resistor (10Ω) is used to improve the linearity while maintaining sufficient voltage headroom for improved far-from-carrier phase-noise. The feedback resistor (10 kΩ) can eliminate the need for a separate biasing network and can improve the overall phase-noise performance of the oscillator. The second stage 464 is also a simple voltage amplifier comprised of a single NPN transistor 1064 in common emitter configuration. Each stage creates ~180° of phase shift and the values of the resistors may be chosen to reduce or minimize the power consumption. The desired voltage gain for the second stage need not be large since the motional impedance of the low frequency resonance mode is not much larger than the high frequency resonance mode counterpart.

Figure 11:
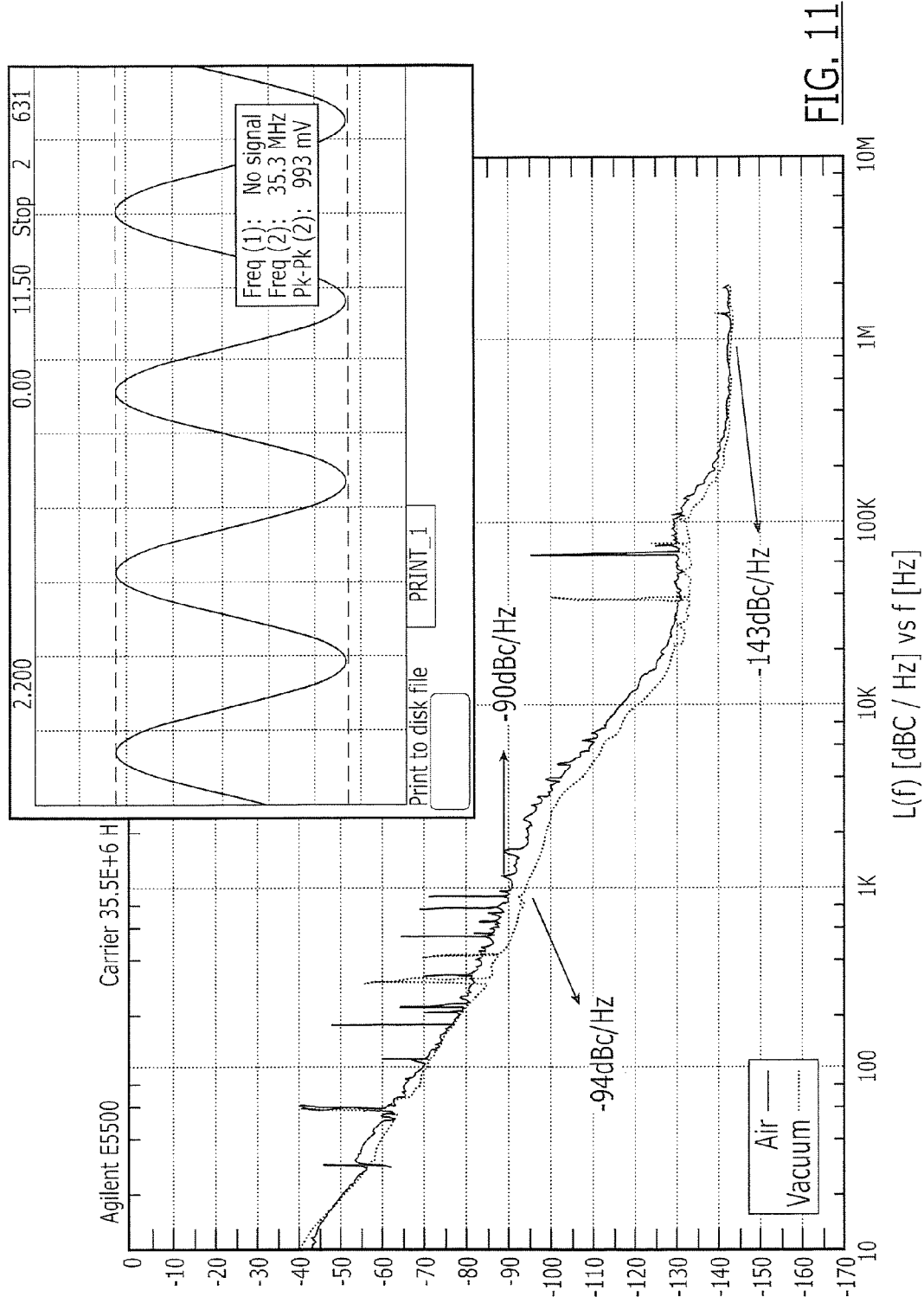
FIG. 11 graphically illustrates a measured waveform and phase noise for a 35 MHz oscillation frequency in air and vacuum according to various embodiments of the present invention.

The measured waveform and phase-noise of the oscillator at the fundamental resonance frequency is shown in FIG. 11. The measurements were carried out with an Agilent EE5500 phase-noise analyzer. An external 50Ω buffer is used to interface the oscillator with the measurement unit.

The oscillation at 35.5 MHz in air starts with 0.86V supply voltage 1010 and 330 μA of current for the two stages combined. Therefore, the power consumption of the circuit at oscillation (35.5 MHz) is <300 μW. The measured phase-noise density plot and the waveform of the oscillator are shown in FIG. 11. The phase-noise measurement is repeated in vacuum and the result is overlapped on the plot in FIG. 11. The oscillation starts at lower supply voltage (0.82V) 1010 in vacuum and the power consumption is reduced to 200 μW. Affected by the improved quality factor of the resonator in vacuum, the close-to-carrier phase-noise is also improved by ~4 dBc/Hz at 1 kHz offset from the carrier unlike the far-from-carrier phase-noise which may be limited by the external buffer.

Figure 12:
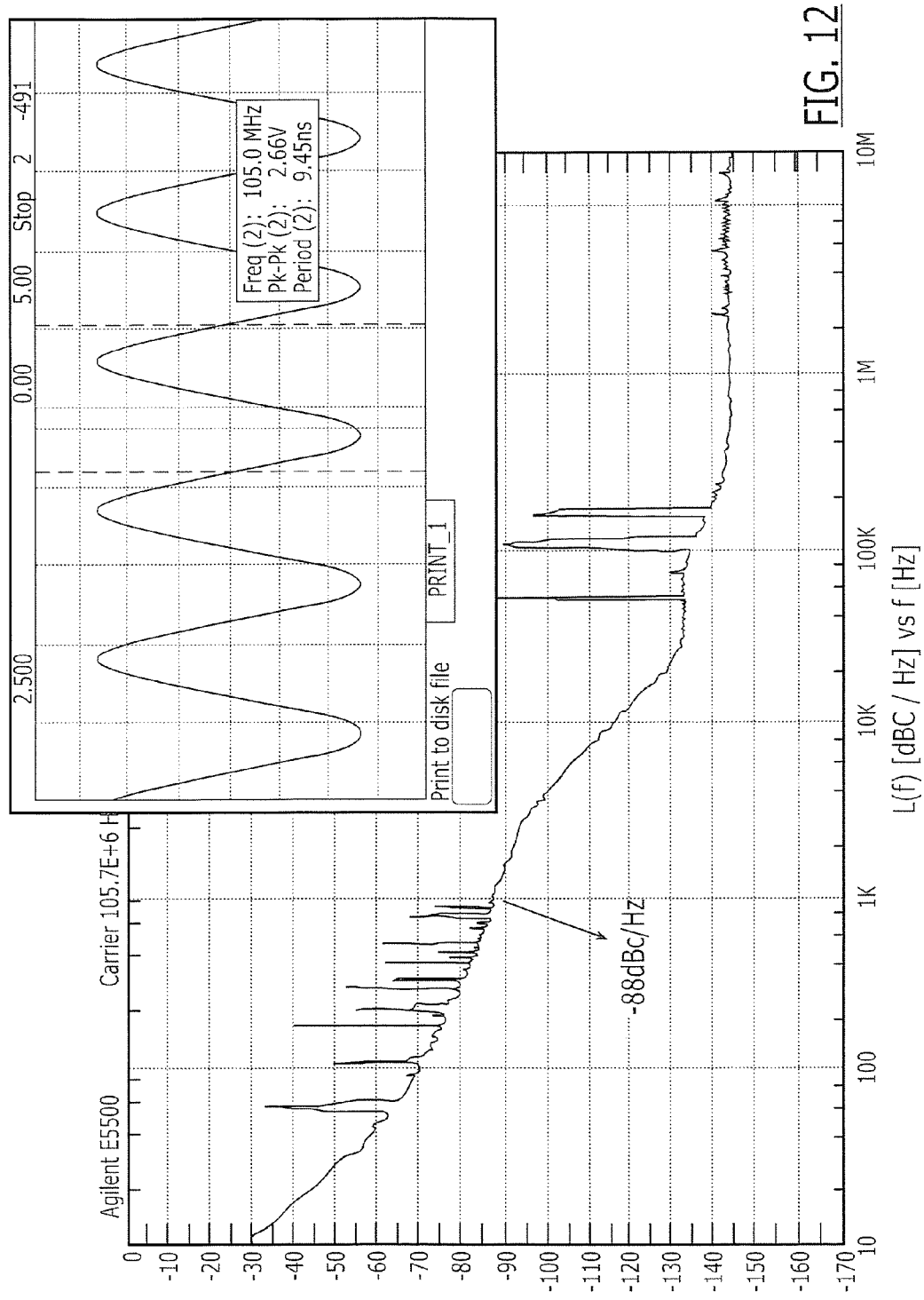
FIG. 12 graphically illustrates a measured waveform and phase noise for a 105.7 MHz oscillation frequency in air according to various embodiments of the present invention.

When the circuit is switched to the single stage operation mode, the oscillation at 105.7 MHz starts with 0.98V supply voltage 1010 and 350 μA current ($P_{min}$~340 μW). The increased power consumption might seem to be counterintuitive after leaving the second amplification stage out of the oscillation loop. This is explained by the higher required bandwidth, which may demand a larger bias current. The measured phase-noise and the waveform of the oscillator at 105.7 MHz are presented in FIG. 12.

One potential advantage of using TPoS resonators in oscillator applications is that despite their small size they can exhibit excellent power handling. Therefore, as opposed to the capacitive micromechanical devices cited above, automatic level control (ALC) circuits may not be needed to guarantee excitation of the resonator in the linear region. Therefore, larger signal levels can be applied to various embodiments of the invention and better far-from-carrier noise density can result while using a simple oscillator circuit with reduced or minimal power consumption in a compact solution.

Accordingly, some embodiments can provide a sub-milli-watt dual-frequency oscillator that utilizes the high-Q first and third-order width-extensional resonance modes of an AlN-on-Si or other microresonator. As a result of signal phase-reversal at the higher-order mode in this oscillator, unlike typical dual-mode quartz crystal oscillators, no mode-suppression circuitry may be needed. These simple and low-power oscillators can be used as resonant sensors that are accurately compensated for environmental interferences such as temperature and pressure. The power consumption for the oscillator circuit measured to be less than 350 μW at both operation frequencies, and as low as 200 μW for the first mode in vacuum.

Other embodiments can provide MEMS-based oscillators that operate in two different frequencies while using a single acoustic component. The utilized resonator can be a Thin-film Piezoelectric-on-Silicon (TPoS) device which can be excited in two different modes (e.g., first-order and the third-order lateral extensional resonance modes). Other resonators that can be excited in these or other modes may be used. A TPoS resonator may comprise a thin-film piezoelectric layer sandwiched between two metallic electrodes stacked on top of a relatively thick single crystal silicon layer. The single crystal silicon layer forms the main body of the resonant structure. The metal electrodes are patterned to match the strain field the targeted resonance mode shapes. With a careful electrode design, the coupling factor is improved or optimized and the motional impedance of the resonator is reduced for the utilized resonance modes. The top electrode may be split into two electrically isolated electrodes. The top electrode may resemble a three- or more-finger interdigitated extensional resonance mode. In this resonance mode opposite charges are accumulated on the two electrodes since the strain polarity is changing form one finger to the other and therefore signal polarity is reversed at resonance. The same electrode pattern can also excite the first-order resonance mode where strain field is uniform across the whole device and consequently the input and output signals are in-phase at resonance. The 180° phase different in the two modes can reduce or prevent the sustaining circuitry from locking into the unwanted mode, hence can provide stable oscillation in each mode. The two modes can be different from those described above, as long at the phase different criteria is retained. Higher-order modes may also be supported.

Accordingly, various embodiments of the invention can be based on the unique design of high-order lateral-extensional thin-film piezoelectric resonators. The fundamental and the high-order modes introduce two different phase shifts in the signal (e.g., 180° different). Therefore, to sustain the oscillation in one of the two particular modes, there may be no need for mode-suppression circuitry usually used in multi-mode crystal oscillators.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

Figure 13:
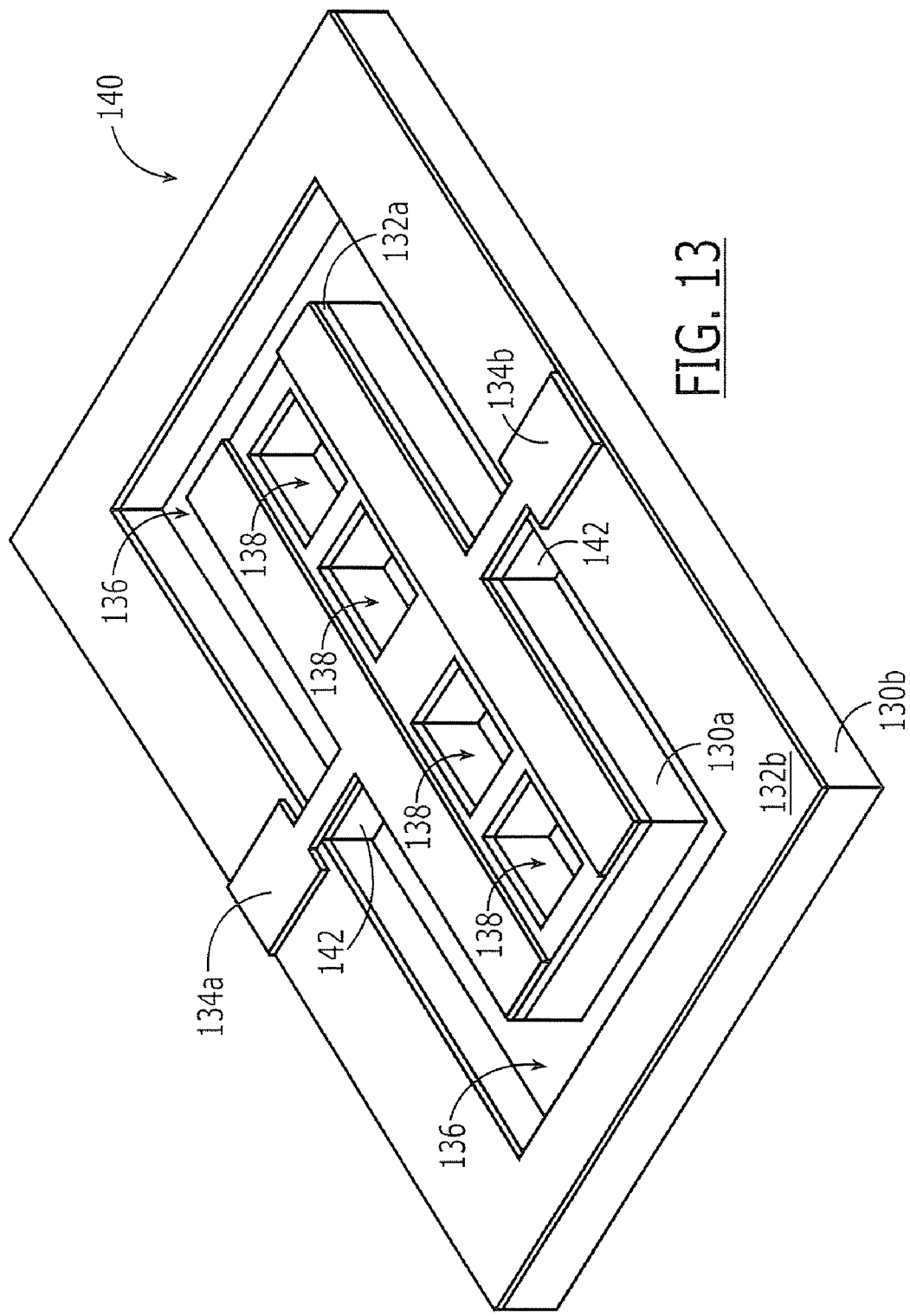
FIG. 13 is a perspective view of a thin-film piezoelectric-on-substrate resonator, according to additional embodiments of the present invention.

Referring now to FIG. 13, a thin-film piezoelectric-on-substrate resonator 140 according to additional embodiments of the present invention includes a resonator body anchored on opposite sides (e.g., by tethers) to a surrounding substrate having an opening therein extending underneath the resonator body. First and second electrodes 134*a* and 134*b* are also provided on the resonator body. As illustrated, the electrodes 134*a* and 134*b* may cover opposite sides of the resonator body, however, many other configurations of electrodes may also be provided, including those described hereinabove. The resonator body includes a composite of at least a suspended semiconductor plate 130*a* and a piezoelectric layer 132*a* on the semiconductor plate 130*a*, however, one or more additional layers, such as a temperature compensation layer, an adhesion layer(s) and a bottom electrode layer (not shown), may also be provided. Although not wishing to be bound by any theory, a combined thickness of the bottom electrode (if any) and top electrode (134*a*, 134*b*) can be maintained at about 0.1 times a thickness of the piezoelectric layer 132*a* in order to make the resonant frequency of the 140 less susceptible to process-induced variations caused by changes in thicknesses of one or more of the electrode and piezoelectric layers. This ratio of about 0.1 between combined thicknesses of the electrodes (top, bottom) and the piezoelectric layer may be treated herein as a preferred layer thickness ratio for the case where the electrodes are formed of molybdenum and the piezoelectric layer is formed of aluminum nitride. Changes in thicknesses of the electrode and piezoelectric layers are anticipated to have a lesser influence on resonant frequency as a thickness of the resonator plate 103a increases.

This resonator body may be formed by selectively etching surrounding trenches 136 through a piezoelectric layer 132b (e.g., AlN layer) and an underlying semiconductor layer 130b, which may be a single crystal silicon substrate layer. This selective etching step operates to release the resonator body from a surrounding substrate in a manner similar to the embodiment illustrated by FIG. 2.

The resonator 140 is also illustrated as including a plurality of perforations 138 (e.g., square-shaped slots) that extend entirely through the piezoelectric layer 132a and the underlying semiconductor plate 130a. These perforations 138 are illustrated as being aligned along a longitudinal axis of the resonator body. This longitudinal axis is orthogonal to an axis extending between the opposing anchors/tethers 142 on opposite sides of the resonator body. Although not wishing to be bound by any theory, the resonator body is configured to self-compensate for process-induced variations in dimensions of the resonator 140 by inhibiting changes in a stiffness-to-mass ratio of the resonator body during fabrication. It is believed that significant changes in the resonant frequency of a resonator can occur in response to process-induced changes in a length and/or width of the resonator body. These process-induced changes in dimension can cause a disproportionate shift in the stiffness of the resonator body relative to a shift in mass of the resonator body.

However, as originally explained in U.S. Provisional Application Ser. No. 61/095,776, filed Sep. 10, 2008, the disclosure of which is hereby incorporated herein by reference, process-induced changes in a stiffness-to-mass ratio of the resonator body can be reduced by designing the resonator body to have at least two parallel extensional members that are coupled by cross members. The cross members are defined by the plurality of perforations 138, which are spaced along a longitudinal axis of the resonator body. These perforations 138, which may be square or similarly-shaped polygonal, circular, or elliptical slots, or even arbitrary-shaped slots (e.g., dog-bone, teardrop, etc.), can extend partially or entirely though the resonator body. The slots can also be defined by the same processes that are used to form the trenches 136, which define the outer dimensions (e.g., length, width) of the resonator body.

Accordingly, the dimensions of the perforations 138 can experience the same process-induced variations that occur to the resonator body during fabrication. Thus, when the resonator body and the perforations 138 change in size in response to process-induced variations, the size, mass and stiffness of the cross members also change. These changes in the size and mass of the cross members operate to compensate for the changes in outer dimensions of the resonator body so that the overall stiffness-to-mass ratio of the resonator body remains relatively unchanged. This means the resonant frequency of the resonator 140 is less susceptible to change, notwithstanding changes in a critical dimension of the resonator body. For example, FIG. 14A illustrates a semiconductor plate 130a' of a resonator body having a plurality of square and rectangular-shaped perforations 138a and 138b therein, which are aligned orthogonal to a nodal line (NL) of the semiconductor plate 130a'. Alternatively, FIG. 14B illustrates a semiconductor plate 130a" of a resonator body having a two-dimensional array of rectangular-shaped perforations 138c therein, which are disposed on opposite sides of a nodal line (NL) of the semiconductor plate 130a". Both of these semiconductor plates 130a' and 130a" may be provided within thin-film piezoelectric-on-substrate resonators according to embodiments of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A micro-electromechanical resonator, comprising:
a resonator body anchored to a substrate by a pair of tethers that suspend said resonator body opposite an underlying opening in the substrate, said resonator body having a plurality of perforations therein that extend through the resonator body and expose the underlying opening in the substrate, said resonator body separated from the substrate by a pair of trenches that surround a majority of the resonator body.

2. The resonator of claim 1, wherein a shape, size, depth and location of the plurality of perforations are sufficient, in combination, to reduce a susceptibility of the resonator to process-induced variations in resonant frequency relative to an otherwise equivalent resonator that omits the plurality of perforations.

3. The resonator of claim 1, wherein a shape, size, depth and location of the plurality of perforations in said resonator body are configured to render a resonant frequency of the resonator less susceptible to changes caused by process-induced variations in dimensions of said resonator body, relative to an otherwise equivalent resonator having a resonator body that is changed in dimension by the same process-induced variations, but is free of the plurality of perforations.

4. The resonator of claim 2, wherein said resonator body is anchored on opposite sides to the substrate; and wherein said resonator body is configured so that a nodal line of said resonator body extends between tethers anchors on the opposite sides of the substrate.

5. The resonator of claim 1, further comprising a first electrode on a surface of said resonator body, said first electrode extending adjacent a first side of the plurality of perforations.

6. The resonator of claim 5, further comprising a second electrode on a surface of said resonator body, said second electrode extending adjacent a second side of the plurality of perforations.

7. The resonator of claim 1, wherein the plurality of perforations are arranged as a two-dimensional array of rectangular slots.

8. The resonator of claim 1, wherein said resonator body comprises a piezoelectric layer; and wherein the plurality of perforations extend through the piezoelectric layer.

9. The resonator of claim 1, wherein a nodal line of said resonator body is uninterrupted by the plurality of perforations.

10. The resonator of claim 1, wherein said resonator body comprises an aluminum nitride piezoelectric layer and molybdenum bottom and top electrodes; and wherein a combined thickness of the bottom and top electrodes is about 0.1 times at thickness of the aluminum nitride piezoelectric layer.

11. A thin-film piezoelectric-on-substrate resonator, comprising:

a resonator body anchored to a substrate by a pair of tethers that suspend said resonator body opposite an underlying opening in the substrate, said resonator body having a plurality of perforations therein that extend along a longitudinal axis of said resonator body that is orthogonal to a nodal line of said resonator body and extend through the resonator body to expose the underlying opening in the substrate, said resonator body separated from the substrate by a pair of trenches that surround a majority of the resonator body.

12. The resonator of claim 11, wherein the plurality of perforations are square-shaped.

13. The resonator of claim 12, further comprising first and second electrodes extending across the pair of tethers, respectively.

14. The resonator of claim 11, wherein said resonator body comprises a piezoelectric layer; and wherein the plurality of perforations extend through the piezoelectric layer.

* * * * *

UNITED STATES PATENT AND TRADEMARK OFFICE
CERTIFICATE OF CORRECTION

PATENT NO. : 7,888,843 B2
APPLICATION NO. : 12/535284
DATED : February 15, 2011
INVENTOR(S) : Ayazi et al.

Page 1 of 1

It is certified that error appears in the above-identified patent and that said Letters Patent is hereby corrected as shown below:

Column 14, Claim 4, Line 42: Please correct "tethers anchors on" to read -- tethers on --

Signed and Sealed this
Sixteenth Day of August, 2011

David J. Kappos
*Director of the United States Patent and Trademark Office*